United States Patent
Yamazaki et al.

(10) Patent No.: US 6,472,949 B1
(45) Date of Patent: Oct. 29, 2002

(54) SIGNAL ATTENUATORS

(75) Inventors: Kazuji Yamazaki; Yoshiki Nagata, both of Kariya (JP)

(73) Assignee: Kabushiki Kaisha Toyoda Jidoshokki Seisakusho, Kariya (JP)

( * ) Notice: Subject to any disclaimer, the term of this patent is extended or adjusted under 35 U.S.C. 154(b) by 0 days.

(21) Appl. No.: 09/711,472

(22) Filed: Nov. 13, 2000

(30) Foreign Application Priority Data

Nov. 12, 1999 (JP) .......................................... 11-323039

(51) Int. Cl.⁷ ................................................ H01P 1/22
(52) U.S. Cl. ..................................... 333/81 R; 307/491
(58) Field of Search ........................ 333/81 R; 307/491

(56) References Cited

U.S. PATENT DOCUMENTS

| | | | |
|---|---|---|---|
| 3,969,666 A | * 7/1976 | Simson | ........................ 323/74 |
| 4,716,315 A | * 12/1987 | Bell | ........................... 307/491 |
| 5,332,981 A | * 7/1994 | Mazzochette et al. | .... 333/81 R |
| 5,361,637 A | * 11/1994 | Judd et al. | ..................... 73/766 |

FOREIGN PATENT DOCUMENTS

JP    8-125451    5/1996

* cited by examiner

*Primary Examiner*—Robert Pascal
*Assistant Examiner*—Joseph Chang
(74) *Attorney, Agent, or Firm*—Morgan & Finnegan, LLP (57) ABSTRACT

A signal attenuator may have a first attenuator (1*t*) and a second attenuator (2*t*). The first attenuator (1*t*) is a π-type resistance attenuator and includes resistors (R1, R2 and R3). The second attenuator (2*t*) is a π-type resistance attenuator and includes resistors (R4, R5 and R6) and negative temperature coefficient thermistor (R7). The first attenuator (1*t*) may be a T-type resistance attenuator. The first attenuator (1*t*) may be connected in series to each of the input and output of the second attenuator (2*t*). Such signal attenuators compensate for changes in signal amplitude caused purely by changes in ambient temperature.

12 Claims, 6 Drawing Sheets

| TEMPERATURE | -20°C [dB] | 25°C [dB] | 60°C [dB] |
|---|---|---|---|
| ATTENUATION | -22.9 | -19.7 | -17 |
| DIFFERENCE | -3.2 | 0 | 2.7 |
| INPUT REFLECTION COEFFICIENT | -30.4 | -33.8 | -41.5 |
| OUTPUT REFLECTION COEFFICIENT | -19.4 | -40.5 | -18.9 |

TARGET (ACCURACY WITHIN ±5dB)

| TEMPERATURE | -20°C [dB] | 25°C [dB] | 60°C [dB] |
|---|---|---|---|
| ATTENUATION | -23 | -20 | -17 |
| DIFFERENCE | -3 | 0 | 3 |

| EXAMPLE | Rth [Ω] | Rs [Ω] | Rp [Ω] | ATTENUATION (UPPER SPACE) DIFFERENCE (LOWER SPACE) | | |
|---|---|---|---|---|---|---|
| | | | | -20°C [dB] | 25°C [dB] | 60°C [dB] |
| X1 | 330 | 910 | 62 | -27.6 / -7.9 | -19.7 / 0 | -13.1 / 6.6 |
| X2 | 470 | 510 | 62 | -24.3 / -4.5 | -19.8 / 0 | -14.3 / 5.5 |
| X3 | 680 | 360 | 62 | -22.2 / -2.7 | -19.5 / 0 | -15.3 / 4.2 |
| X4 | 1000 | 300 | 62 | -21.5 / -1.6 | -19.9 / 0 | -16.5 / 3.4 |

SIGNAL ATTENUATORS

BACKGROUND OF THE INVENTION

1. Field of the Invention

The present invention relates to electronic circuits and, more particularly, to signal attenuators that can compensate for signal amplitude changes caused by changes in temperature.

2. Description of the Related Art

A known signal attenuator is disclosed, for example, in Japanese Laid-Open Patent Publication No. 8-125451, which signal attenuator is typically used to compensate for gain variations in a high-frequency circuit (such as a high-frequency amplifier circuit) that includes one or more temperature-sensitive semiconductor devices. Because the gain of such a high-frequency amplifier circuit typically decreases as the ambient temperature rises, the known signal attenuator functions to decrease the signal attenuation as the temperature rises and thereby compensate for gain variations caused by temperature changes. Thus, the high-frequency amplifier allegedly has more uniform characteristics over a variety of temperatures.

Figure 11:
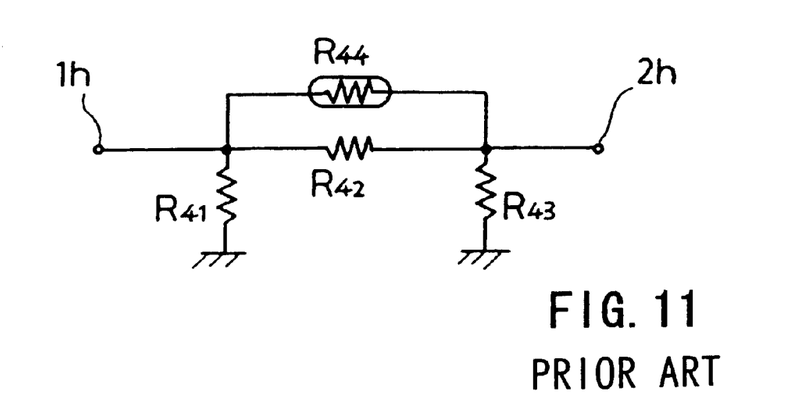
FIG. 11 is a circuit diagram of a known signal attenuator.

FIG. 11 shows a 50Ω π-type signal attenuator of Japanese Laid-Open Patent Publication No. 8-125451, which includes resistors R41, R42 and R43 and a negative temperature coefficient (NTC) thermistor R44. The resistor R41 and the NTC thermistor R44 are connected in parallel between an input terminal 1h and an output terminal 2h. Input terminal 1h is connected to a pre-stage amplifier circuit (not shown) and input terminal 2h is connected to a post-stage amplifier circuit (not shown).

Problem of the Related Art Discovered by the Inventors

Figure 12:
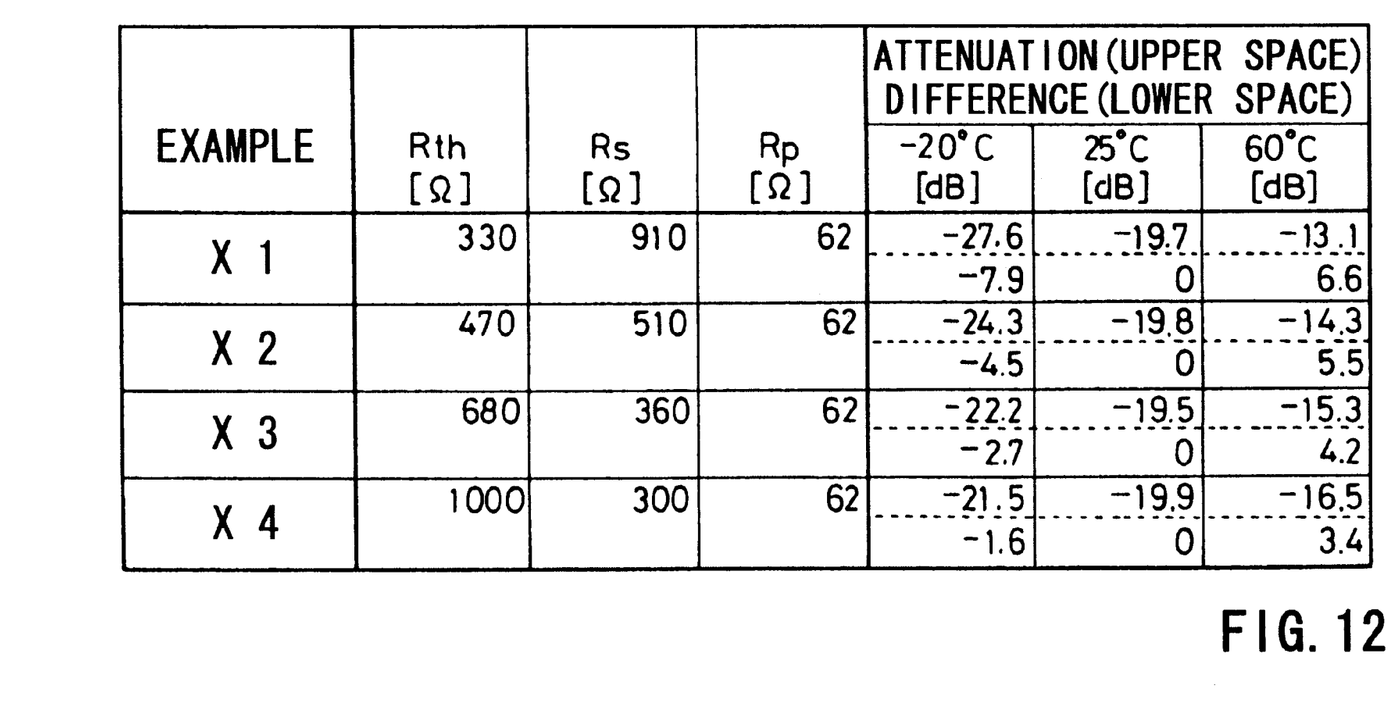
FIG. 12 is a table prepared by the inventors that shows the signal attenuation characteristics of the circuit of FIG. 11.
Figure 13:
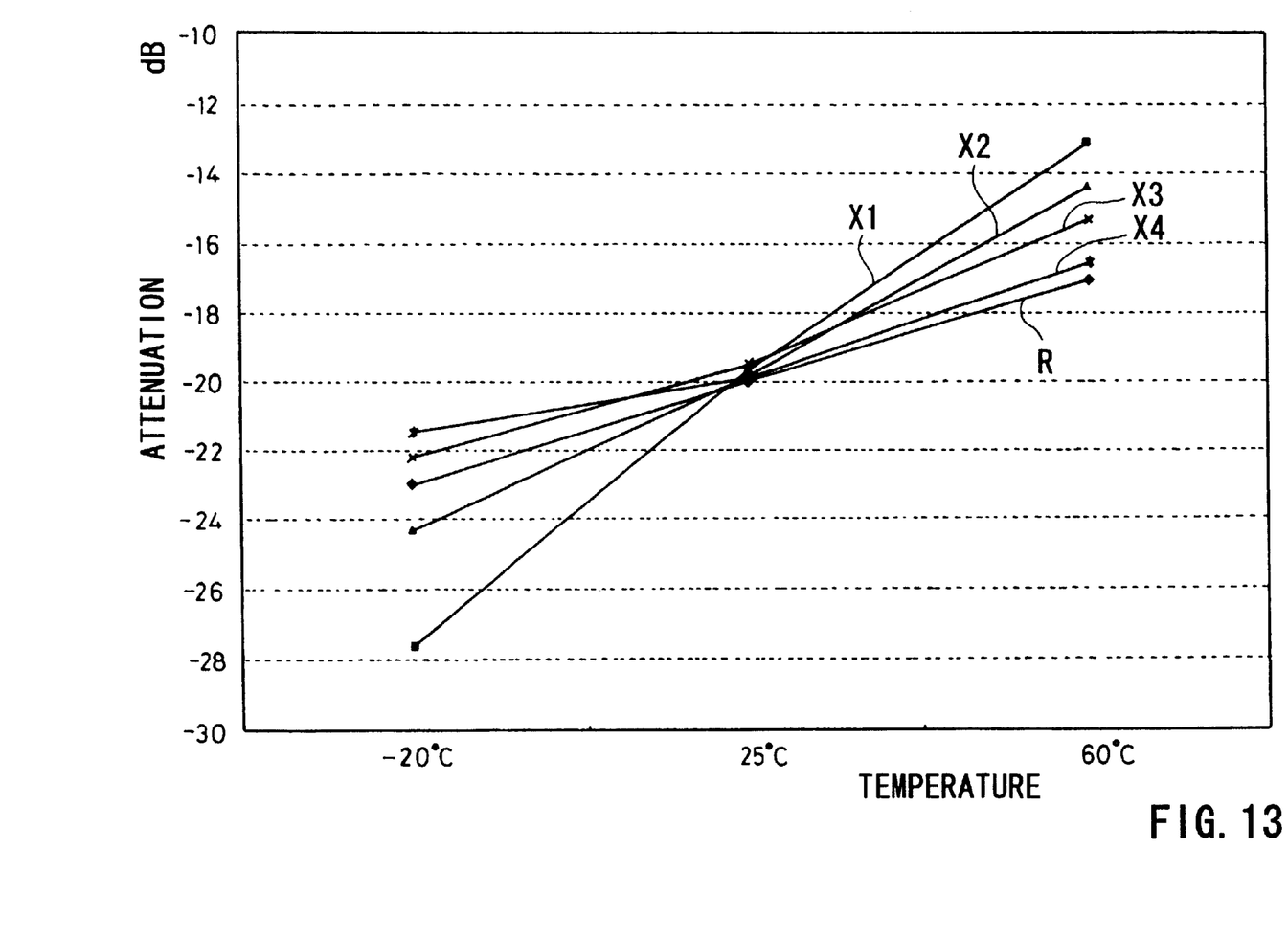
FIG. 13 is a graph prepared by the inventors that shows the signal attenuation characteristics of the circuit of FIG. 11.

As a result of experiments performed by the inventors using the known signal attenuator of FIG. 11, the table shown in FIG. 12 was prepared and shows the signal attenuation characteristics of the known signal attenuator. In addition, FIG. 13 is a graph showing the signal attenuation characteristics of the signal attenuator shown in FIG. 11.

In FIG. 12, Rp designates the combined resistance of resistors R41 and R43, Rs designates the resistance of resistor R42 and Rth designates the resistance of the thermistor R44. In FIG. 12 signal attenuation is calculated by dividing the voltage at the output terminal 2h by the voltage at the input terminal 1h. Signal attenuation for four circuits (Examples X1 to X4) having different resistances Rp, Rs, Rth were determined at 25° C., −20° C. and 60° C. and the results are shown in FIG. 12. The signal attenuation of the circuits of Examples X1 to X4 was set to about −20 dB at 25° C. (room temperature). The difference between the signal attenuation value (dB) at −20° C. and at 25° C. and the difference between the signal attenuation at 60° C. and at 25° C. are shown in the space below each signal attenuation value (dB).

Figure 6:
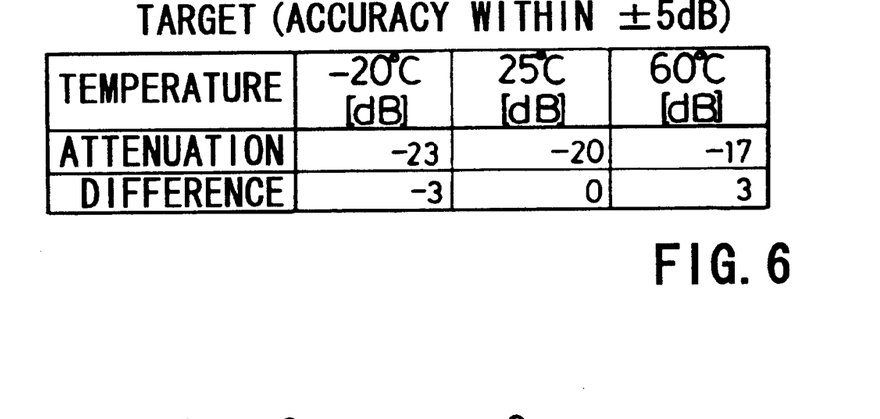
FIG. 6 is a table showing the target values of the signal attenuation characteristics of the first representative embodiment.

On the other hand, the signal attenuation characteristics shown in FIG. 6, which were prepared based upon a signal attentuator developed by the inventors, have been assumed to be the target or desired values for the known signal attenuator of FIG. 11.

When the resistances of the resistors R41, R42 and R43 and the negative temperature coefficient thermistor R44 are chosen so that the signal attenuation (the median value of the signal attenuation) is set to a specific target value (e.g. −20 dB) at a specific temperature (e.g. 25° C.), the variation of the signal attenuation with variations of temperature is uniquely determined. Further, the type of thermister Rth that can be used with this known signal attenuator is limited in practice. Therefore, it is difficult to independently set the desired signal attenuation (the median value of the signal attenuation) for a specific temperature and the desired variation (the gradient) of the signal attenuation as the temperature changes. Thus, useful signal attenuators can not be easily designed using the teachings of Japanese Laid-Open Patent Publication No. 8-125451.

For example, in Examples X1 to X4 shown in FIG. 12, the difference between the signal attenuation at −20° C. and at 25° C. and the difference between the signal attenuation at 60° C. and at 25° C. are not the desirable target values shown in FIG. 6. FIG. 13 is a graph showing the signal attenuation characteristics of Examples X1 to X4 and the target signal attenuation characteristics, which characteristics are shown by lines [X1] to [X4] and [R], respectively.

Thus, the signal attenuation (the median value of the signal attenuation) at a specific temperature may be set as the desired target value. However, if the variation (the gradient) in signal attenuation as the temperature changes is not the desired target gradient, the signal attenuator cannot properly compensate for the gain variations of the high frequency circuit caused by temperature variations.

SUMMARY OF THE INVENTION

It is, accordingly, an object of the present teachings to provide improved signal attenuators.

In one aspect of the present teachings, signal attenuators are taught that are capable of providing highly useful signal attenuation characteristics over a broad range of temperatures. These signal attenuators can substantially reduce or eliminate variations in signal amplitude caused by temperature-sensitive semiconductor devices.

According to another aspect of the present teachings, signal attenuators may include a first attenuator that does not have a temperature-compensating element and a second attenuator that has a temperature-compensating element. If the signal attenuator only includes the second attenuator having a temperature-compensating element, as described in Japanese Laid-Open Patent Publication No. 8-125451, the signal attenuator will not be capable of providing a desired signal attenuation (the median value of the signal attenuation) at a specific temperature and a useful attenuation gradient as the temperature changes. However, the present teachings provide the first attenuator, which does not have a temperature-compensating element, in addition to the second attenuator that does have a temperature-compensating element. Therefore, the signal attenuator of the present teachings is capable of independently setting the median value of the signal attenuation and the gradient of the signal attenuation. More particularly, the median value of the signal attenuation and the gradient of the signal attenuation can be independently set by combining the signal attenuation characteristics of the second attenuator (i.e. having a temperature-compensating element) with the signal attenuation characteristics of the first attenuator (i.e. not having a temperature-compensating element).

Preferably, the first and the second attenuators may comprise resistors and a thermistor may be the temperature-compensating element. With this construction, the signal attenuation characteristics of the signal attenuator do not change with changes in signal frequency. Therefore, this signal attenuator may preferably be utilized to attenuate signals from a temperature-sensitive high frequency circuit, such as a high-frequency amplifier.

Further, the first and the second attenuators may be preferably connected in series. With this construction, the signal-attenuation of the signal attenuator is determined by the sum of the signal attenuation of the first attenuator and the signal attenuation of the second attenuator. Therefore, the signal attenuation characteristics of the signal attenuator can be easily set.

Further, at least one of the resistors in the first attenuator may preferably be a variable resistor. In this case, the signal attenuation characteristics of the first attenuator can be adjusted by adjusting the resistance of the variable resistor of the first attenuator. Therefore, the signal attenuation characteristics of the signal attenuator can be easily set. Such signal attenuators may be preferably utilized to encode data in a radio transmitter that uses spread spectrum signals.

Additional objects, features and advantages of the present invention will be readily understood after reading the following detailed description together with the accompanying drawings and the claims.

DETAILED DESCRIPTION OF THE INVENTION

Signal attenuators for attenuating the amplitude of input signals and/or output signals are generally provided on the input side and/or the output side of a circuit having a temperature-sensitive element. The signal attenuation characteristics of the signal attenuators are set in a manner to compensate for variations in signal amplitude caused purely by temperature changes.

Throughout this specification, the term "signal attenuator" is intended to mean a resistive or capacitive circuit designed to lower a signal amplitude to a desired value without distorting the signal waveform. Signal attenuators that have temperature sensitive characteristics are also known as variable attenuators (i.e. the amount of signal attenuation changes with changes in ambient temperature). The term "thermistor" is intended to mean a temperature-sensitive semiconductor device possessing a negative temperature coefficient (i.e., resistance decreases as temperature increases) or a positive temperature coefficient (i.e. resistance increases as temperature increases).

A signal attenuator according to the present teachings may include at least one first attenuator that does not have a temperature-compensating element and at least one second attenuator that has a temperature-compensating element. By providing the first attenuator not having a temperature compensating element in addition to the second attenuator having a temperature compensating element, the median value of the signal attenuation and the gradient of the signal attenuation (as the temperature changes) can be set independently of each other. Therefore, the signal attenuation characteristics of the signal attenuator can be accurately set to a target signal attenuation characteristic corresponding to the temperature characteristics of the circuit. Thus, the input and/or output of a temperature-sensitive circuit can be properly compensated for signal amplitude changes caused purely by changes in ambient temperature.

Signal attenuators having signal attenuation characteristics that do not substantially change with changes in signal frequency may be preferably utilized as a signal attenuator for a high-frequency circuit, such as a high-frequency amplifier circuit, and more preferably in high frequency amplifier circuits that encode spread spectrum signals.

In another representative embodiment of the present teachings, the first and the second attenuators may comprise resistors and a thermistor may be used as the temperature-compensating element. With such a signal attenuator constructed solely of resistors, the signal attenuation characteristics of the signal attenuator do not change with frequency. The resistance attenuator may be π-type or T-type.

For signal attenuators comprising the first and the second attenuators, it is necessary to set the signal attenuation characteristic of the signal attenuator to target signal attenuation value by adjusting the signal attenuation characteristics of the first and the second attenuators.

In another preferred embodiment of the invention, the first and the second attenuators may be connected in series. With this construction, the overall signal attenuation characteristics of the signal attenuator are determined by the sum of the signal attenuation characteristics of the first and the second attenuators. Therefore, the signal attenuation characteristics of the signal attenuator can be easily set.

Further, in order to set the overall signal attenuation parameters of the signal attenuator to preferred target signal attenuation parameters, the signal attenuation characteristics of the first attenuator can be set after the signal attenuation characteristics of the second attenuator have been fixed.

In another embodiment of the present teachings, the first attenuator may comprise at least one variable resistor. In this case, the signal attenuation characteristics of the first attenuator can be adjusted by adjusting the resistance of the variable resistor of the first attenuator. Therefore, the signal attenuation characteristics of the signal attenuator can be easily set.

Further, in another embodiment of the present teachings, a plurality of first attenuators may be provided. With this construction, the signal attenuation characteristics of the signal attenuator can be set with higher accuracy.

Each of the additional features disclosed above and below may be utilized separately or in conjunction with other features to provide improved signal attenuators. Representative examples of the present invention, which examples utilize many of these additional features in conjunction, will now be described in detail with reference to the attached drawings. This detailed description is merely intended to teach a person of skill in the art further details for practicing preferred aspects of the present teachings and is not intended to limit the scope of the invention. Only the claims define the scope of the claimed invention. Therefore, combinations of features and steps disclosed in the following detail description may not be necessary to practice the invention in the broadest sense, and are instead taught merely to particularly describe some representative examples of the invention.

Figure 1:
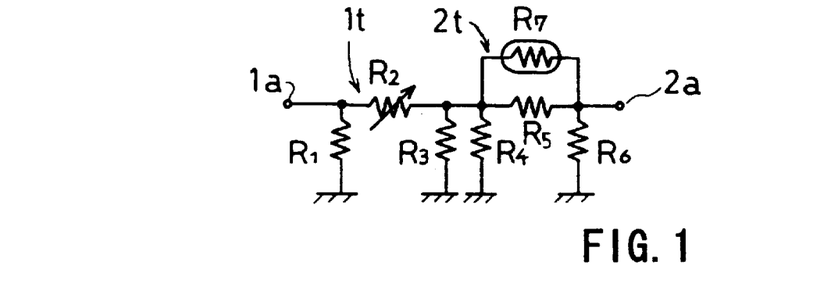
FIG. 1 is a circuit diagram of a first representative embodiment of this invention.

FIG. 1 is a circuit diagram of a first representative signal attenuator, which may include a first attenuator $1t$ and a second attenuator $2t$ connected in series. The first attenuator $1t$ may be a π-type resistance attenuator and may include resistors R1, R2 and R3. The resistor R2 may have a fixed resistance or a variable resistance. The second attenuator $2t$ may be a π-type resistance attenuator and may include resistors R4, R5 and R6 and a negative temperature coefficient thermistor R7. The resistance of the thermistor R7 decreases as the temperature rises and the resistance increases as the temperature decreases. The thermistor R7 is connected in parallel with the resistor R5. Therefore, if the thermistor R7 and the resistor R5 are connected in parallel, the resistance of the total circuit decreases as the temperature rises and increases as the temperature decreases.

The first attenuator $1t$ may have input terminal $1a$ and the second attenuator $2t$ may have an output terminal $2a$. The input terminal $1a$ and the output terminal $2a$ are preferably connected to a pre-stage amplifier circuit and a post-stage amplifier circuit (not shown), respectively. The signal attenuator compensates for gain variations of the pre-stage and the post-stage amplifier circuits in order to reduce or eliminate variations in signal amplitude caused by temperature variations. In some cases, a high-frequency amplifier circuit may be connected only to the input terminal $1a$ or the output terminal $2a$.

In the known art, the signal attenuator only include the second attenuator $2t$. Therefore, when the resistances of the resistors R4 to R6 and the negative temperature coefficient thermistor R7 are set such that the signal attenuation has a target value at a predetermined temperature (e.g. 25° C.), the variation of the signal attenuation as the ambient temperature varies from the predetermined temperature will be uniquely determined. That is, the attenuation gradient can not be reliably set. Further, the signal attenuation (the median value of the signal attenuation) at a predetermined temperature and the variation (the gradient) of the signal attenuation as the temperature varies cannot be set independently of each other. Thus, the known signal attenuator has a low degree of freedom of design. In practice, the type of negative temperature coefficient thermister R7 that can be utilized with the known signal attenuator is limited. Therefore, it is difficult to accurately set the signal attenuation characteristics using the known signal attenuator (i.e. the median value of the signal attenuation and the radient of the signal attenuation).

On the other hand, in this embodiment, the first attenuator $1t$ and the second attenuator $2t$ are provided and connected in series. With this construction, the overall signal attenuation characteristics of the signal attenuator is determined by the signal attenuation characteristics of the first and the second attenuators. Therefore, the signal attenuation characteristics of the second attenuator $2t$ can be compensated by adjusting the signal attenuation characteristics of the first attenuator $1t$. Specifically, if the first and the second attenuators $1t$ and $2t$ are connected in series, the median value of the signal attenuation and the gradient of the signal attenuation can be set independently of each other. Thus, the signal attenuators of the present teachings have an increased degree of freedom of design.

For example, when the signal attenuation of the first attenuator $1t$ is 10 dB and the signal attenuation of the second attenuator $2t$ is 10 dB±3 dB at any given temperature, the signal attenuation of the signal attenuator, which has the first and the second attenuators $1t$ and $2t$ connected in series, is 20 dB±3 dB at any given temperature. Further, the resistors R2 and R5 may comprise variable resistors. In this case, the median value of the signal attenuation can be adjusted by adjusting the resistances of the variable resistors R2 and R5.

Figure 4:
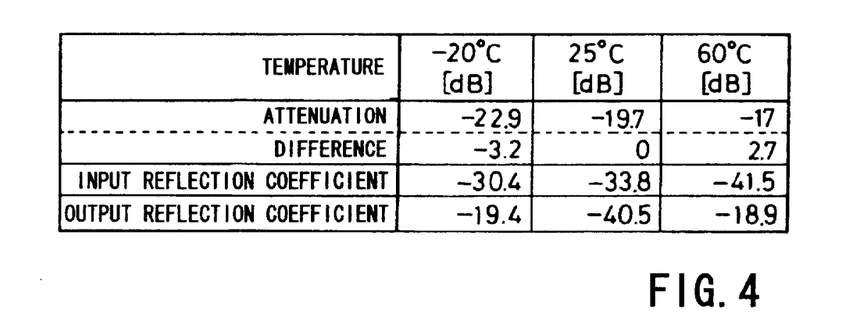
FIG. 4 is a table showing the signal attenuation characteristics of the first representative embodiment shown in FIG. 1.

FIG. 4 is a table showing the signal attenuation characteristics of a representative 50Ω signal attenuator. In this case, the resistances of the resistors R1, R3, R4, R6 are 100Ω, the resistance of the resistor R2 is 75Ω, and the resistance of the resistor R5 is 150Ω. Further, the negative temperature coefficient thermistor R7 has a resistance of 130Ω at room temperature (i.e. 25° C.). FIG. 4 shows S-parameters (signal attenuation, difference, input reflection coefficient and output reflection coefficient) of the temperature-variable signal attenuator shown in FIG. 1 that were calculated assuming that the attenuator is a two-part network. Specifically, the signal attenuation characteristics at −20° C., 25° C. and 60° C. were determined.

As shown in FIG. 4, the signal attenuation of the signal attenuator shown in FIG. 1 is −19.7 dB at 25° C., −22.9 dB at −20° C. and −17 dB at 60° C. The differences between the signal attenuation at −20° C. and 60° C. and the signal attenuation at 25° C. are −3.2 dB [−22.9 −(−19.7)] and=−2.7 dB [−17−(−19.7)], respectively, which are substantially equal to the target values shown in FIG. 6.

Figure 5:
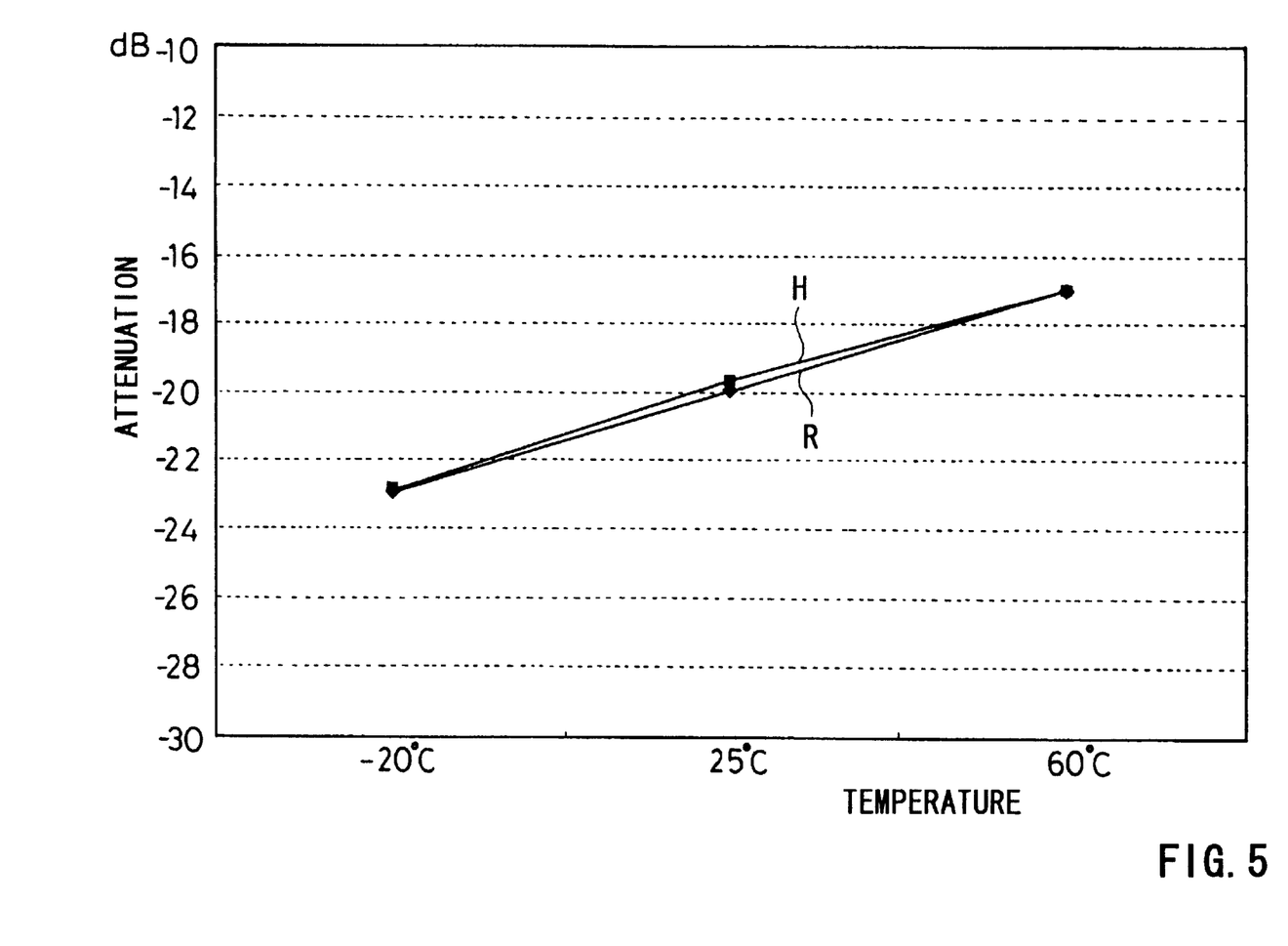
FIG. 5 is a graph showing the signal attenuation characteristics of the first representative embodiment.

FIG. 5 is a graph showing the signal attenuation characteristics described in FIG. 4. In FIG. 5, the actual attenuation is shown by line [H] and the target signal attenuation is shown by line [R].

Further, if the signal attenuator comprises resistors and a thermistor according to the present teachings, the signal attenuation characteristics of the signal attenuator do not change with signal frequency. Therefore, these signal attenuators are particularly suitable for high-frequency circuits.

Figure 2:
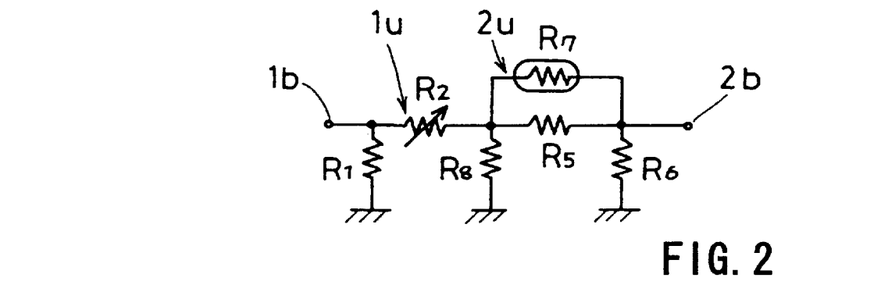
FIG. 2 is a circuit diagram of a second representative embodiment.

FIG. 2 is a circuit diagram of a signal attenuator of a second representative embodiment, which is a modification of the first representative embodiment shown in FIG. 1. This signal attenuator may include a first attenuator $1u$ and a second attenuator $2u$. The resistance of a resistor R8 of the second embodiment is equal to the resistance of a circuit having the resistors R3 and R4 (of the first representative embodiment) connected in parallel. Further, the signal attenuator of this embodiment may have an input terminal $1b$ and an output terminal $2b$. The remaining construction is the same as the first embodiment. Therefore, the signal attenuator of this embodiment has the same signal attenuation characteristics as the first embodiment.

Preferably, the thermistor may be part number NTCCM1005 manufactured by TDK and the resistors may be part number ERJ2GE manufactured by Matsushita Electric Industrial Company.

Figure 3:
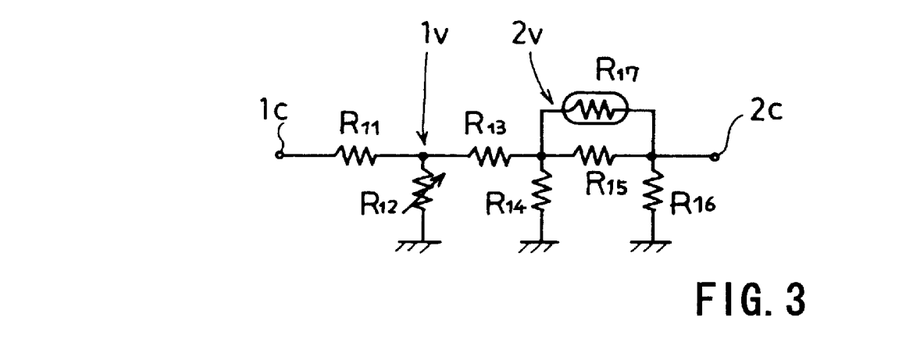
FIG. 3 is a circuit diagram of a third representative embodiment.

FIG. 3 is a circuit diagram of a signal attenuator of a third representative embodiment, which is- a modification of the first representative embodiment. This signal attenuator may include a first attenuator 1v and a second attenuator 2v. The first attenuator 1v may be a T-type resistance attenuator and may include resistors R11, R12 and R13. The resistor R12 may have fixed or a variable resistance. The first attenuator 1v (T-type resistance attenuator) can be changed to the first attenuator 1t (π-type resistance attenuator) shown in FIG. 1 by Y-Δ conversion. The second attenuator 2v shown in FIG. 3 may be a π-type resistance attenuator and may include resistors R14, R15 and R16 and a negative temperature coefficient thermistor R17. The second attenuator 2v is the same as the second attenuator 2t of the first embodiment. Further, the signal attenuator of this embodiment may have an input terminal 1c and an output terminal 2c. Therefore, the signal attenuator of this embodiment has the same signal attenuation characteristics as the first embodiment.

In the above first to third embodiments, the first attenuators 1t, 1u and 1v can be connected to the second attenuators 2t, 2u and 2v, respectively, in a reversed positional relationship, without changing the signal attenuation characteristics of the circuit.

Figure 7:
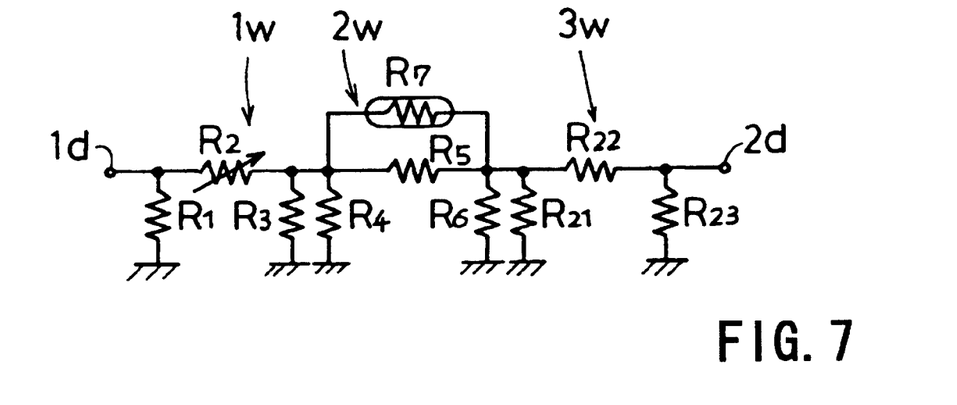
FIG. 7 is a circuit diagram of a fourth representative embodiment.

FIG. 7 is a circuit diagram of a signal attenuator of a fourth representative embodiment. This signal attenuator may include a first attenuator 1w, a second attenuator 2w and a third attenuator 3w connected in series. The first attenuator 1w and the second attenuator 2w are the same as the first attenuator 1t and the second attenuator 2t of the first embodiment. The third attenuator 3w may be a π-type resistance attenuator and may include resistors R21, R22 and R23. Further, the signal attenuator of this embodiment may have an input terminal 1d and an output terminal 2d.

Figure 8:
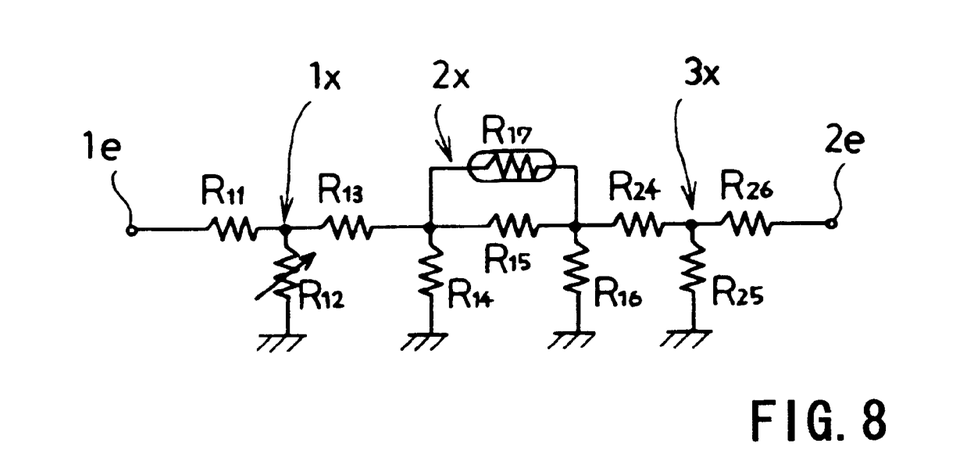
FIG. 8 is a circuit diagram of a fifth representative embodiment.

FIG. 8 is a circuit diagram of a signal attenuator of a fifth representative embodiment. This signal attenuator may include a first attenuator 1x, a second attenuator 2x and a third attenuator 3x connected in series. The first attenuator 1x and the second attenuator 2x are the same as the first attenuator 1v and the second attenuator 2v of the third embodiment shown in FIG. 3. The third attenuator 3x may be a T-type resistance attenuator and may include resistors R24, R25 and R26. Further, the signal attenuator of this embodiment may have an input terminal 1e and an output terminal 2e.

Figure 9:
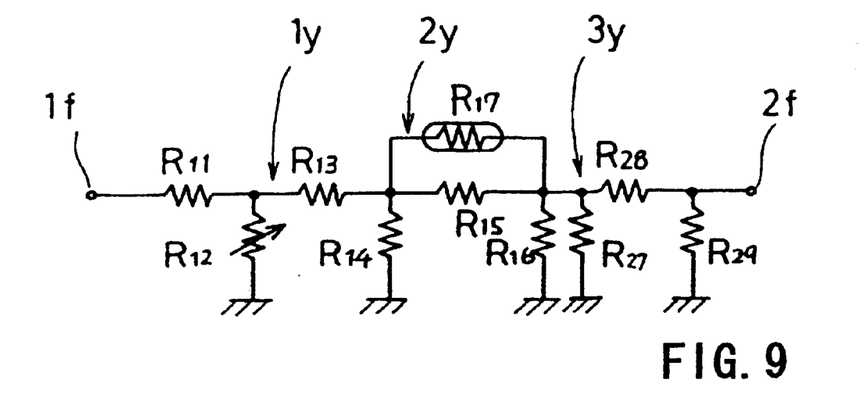
FIG. 9 is a circuit diagram of a sixth representative embodiment.

FIG. 9 is a circuit diagram of a signal attenuator of a sixth representative embodiment. This signal attenuator may include a first attenuator 1y, a second attenuator 2y and a third attenuator 3y connected in series. The first attenuator 1y and the second attenuator 2y are the same as the first attenuator 1v and the second attenuator 2v of the third embodiment shown in FIG. 3. The third attenuator 3y may be a π-type resistance attenuator and may include resistors R27, R28 and R29. Further, the signal attenuator of this embodiment may have an input terminal 1f and an output terminal 2f.

Figure 10:
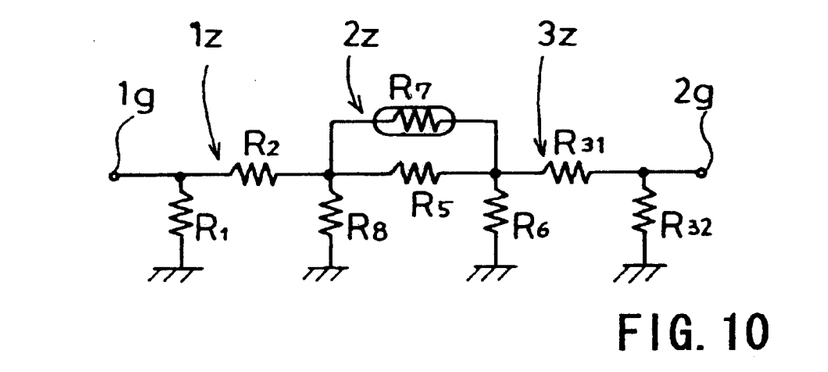
FIG. 10 is a circuit diagram of a seventh representative embodiment.

FIG. 10 is a circuit diagram of a signal attenuator of a seventh representative embodiment. This signal attenuator may include a first attenuator 1z, a second attenuator 2z and a third attenuator 3z connected in series. The first attenuator 1z and the second attenuator 2z are the same as the first attenuator 1u and the second attenuator 2u of the second embodiment shown in FIG. 2. The third attenuator 3z may be substantially a π-type resistance attenuator and may include resistors R6, R31 and R32. Further, the signal attenuator of this embodiment may have an input terminal 1g and an output terminal 2g.

In the fourth to seventh embodiments, because the first attenuators 1w to 1z, the second attenuators 2w to 2z, the third attenuators 3w to 3z are connected in series, the signal attenuation at a predetermined temperature (e.g. room temperature) and the variation of the signal attenuation with temperature variations can be set independently of each other. Therefore, the signal attenuation characteristics of the signal attenuators can be set to the target signal attenuation characteristics with high accuracy.

As described above, with the signal attenuators of the present invention, which comprise a combination of an attenuator having a temperature compensating element and an attenuator not having a temperature compensating element, the signal attenuation (the median value of the signal attenuation) at a predetermined temperature and the variation (the gradient) of the signal attenuation as the temperature varies can be set independently of each other. Therefore, such signal attenuators have signal attenuation characteristics that can easily be set to target signal attenuation characteristics and thus can, for example, properly compensate for temperature-sensitive gain variations of a high frequency amplifier circuit.

The present invention is not limited to the constructions that have been described as the representative embodiments, but rather, may be added to, changed, replaced with alternatives or otherwise modified without departing from the spirit and scope of the invention. For example, while the attenuators have been described as being π-type or T-type resistance attenuators, other types of resistance attenuators may be utilized. Further, the attenuators may comprise elements other than resistors. In addition, although negative temperature coefficient thermistors were described in the representative embodiments, positive temperature coefficient (PTC) thermistors may also be utilized, the resistance of which will increase as the temperature rises.

Moreover, other types of temperature compensating elements may be utilized instead of or in addition to a thermistor. Signal attenuators of the present teachings may be used for purposes other than to compensate for gain variations of high frequency amplifier circuits. Further, while the representative signal attenuators have two or three attenuators connected in series, four or more attenuators may in fact be connected in series and a plurality of attenuators may be connected in parallel.

What is claimed is:

1. A signal attenuator adapted to attenuate a signal amplitude, comprising:
   at least one first attenuator that does not comprise a temperature compensating element, and
   at least one second attenuator comprising a temperature compensating element.

2. A signal attenuator as in claim 1, wherein the first and the second attenuators comprise resistors and the temperature-compensating element comprises a thermistor.

3. A signal attenuator as in claim 2, wherein the first and the second attenuators are connected in series.

4. A signal attenuator as in claim 2, wherein the second attenuator is a π-type resistance attenuator.

5. A signal attenuator as in claim 4, wherein the first attenuator is a π-type resistance attenuator.

6. A signal attenuator as in claim 4, wherein the first attenuator is a T-type resistance attenuator.

7. A signal attenuator as in claim 2, comprising at least two first attenuators, wherein the first attenuators are respectively connected in series to an input and output of the second attenuator.

8. A signal attenuator as in claim 2, wherein at least one of the resistors of the first attenuator is a variable resistor.

9. An electric circuit adapted to substantially uniform signal attenuation despite variations in ambient temperature, comprising:

first means for providing a target signal attenuation at a specific temperature coupled to second means for providing a target signal attenuation gradient across a range of temperatures.

10. An electric circuit as in claim 9, wherein the second means comprises a negative temperature coefficient thermistor.

11. An electric circuit as in claim 10, further comprising a pre-stage high frequency amplifier circuit coupled to the first means and a post-stage high frequency amplifier circuit coupled to the second means.

12. An electric circuit as in claim 11, wherein the first means consists of resistors and the second means consists of resistors and a thermistor.

* * * * *

UNITED STATES PATENT AND TRADEMARK OFFICE
CERTIFICATE OF CORRECTION

PATENT NO.   : 6,472,949 B2         Page 1 of 1
DATED        : October 29, 2002
INVENTOR(S)  : Yamazaki et al.

It is certified that error appears in the above-identified patent and that said Letters Patent is hereby corrected as shown below:

Column 5,
Line 60, please delete "and the radient" and insert therefore -- and the gradient --;

Column 6,
Line 67, please delete "which is- a" and insert therefore -- which is a --.

Signed and Sealed this

Twenty-fifth Day of February, 2003

JAMES E. ROGAN
*Director of the United States Patent and Trademark Office*